United States Patent
Park et al.

(10) Patent No.: US 7,745,314 B2
(45) Date of Patent: Jun. 29, 2010

(54) METHOD OF DEGASSING THIN LAYER AND METHOD OF MANUFACTURING SILICON THIN FILM

(75) Inventors: Kyung-bae Park, Yongin-si (KR);
Jong-man Kim, Yongin-si (KR);
Jang-yeon Kwon, Yongin-si (KR);
Ji-sim Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 542 days.

(21) Appl. No.: 11/692,236

(22) Filed: Mar. 28, 2007

(65) Prior Publication Data

US 2007/0264800 A1    Nov. 15, 2007

(30) Foreign Application Priority Data

May 15, 2006    (KR)    ............ 10-2006-0043463

(51) Int. Cl.
*H01L 21/20*    (2006.01)
(52) U.S. Cl. .............. 438/482; 438/486; 438/487; 257/E21.297
(58) Field of Classification Search .............. 438/123, 438/482, 486–489; 257/E21.297
See application file for complete search history.

(56) References Cited

U.S. PATENT DOCUMENTS 6,133,076 A * 10/2000 Yamazaki et al. ............ 438/166

* cited by examiner

*Primary Examiner*—Thanh Nguyen
(74) *Attorney, Agent, or Firm*—Cantor Colburn LLP

(57) ABSTRACT

A method of degassing a thin layer and a method of manufacturing a silicon thin film includes applying microwaves to a silicon thin film deposited on a substrate to induce a resonance of impurities of $H_2$, Ar, He, Xe, $O_2$, and the like present in the silicon thin film so as to remove the impurities from the silicon thin film. A wavelength of the microwaves is equal to a natural frequency of an element of an object to be removed. According to a resonance of impurities induced by microwaves, the impurities can be very effectively removed from the silicon thin film so as to obtain a high quality silicon thin film. In particular, the microwaves are very suitable to be used in the manufacture of silicon thin films at low temperature.

21 Claims, 4 Drawing Sheets

METHOD OF DEGASSING THIN LAYER AND METHOD OF MANUFACTURING SILICON THIN FILM

This application claims priority to Korean Patent Application No. 10-2006-0043463, filed on May 15, 2006 and all the benefits accruing therefrom under 35 U.S.C. §119, the contents of which in its entirety are herein incorporated by reference.

BACKGROUND OF THE INVENTION

1. Field of the Invention

The present invention relates to a method of degassing a thin layer and a method of manufacturing a silicon thin film, and more particularly, the present invention relates to a method of removing a gas impurity formed in a silicon thin film during formation of the silicon thin film and a method of manufacturing such a silicon thin film on a substrate.

2. Description of the Related Art

Poly crystalline silicon ("poly-Si") has a higher mobility than amorphous silicon ("a-Si") and thus is applied to various electronic devices including flat panel display ("FPD") devices, solar batteries, and the like.

In general, a material robust to heat, for example, glass, is used to obtain high quality poly crystalline silicon. Poly crystalline silicon is formed on a material such as glass robust to heat at a high temperature using an a-Si deposition method such as chemical vapor deposition ("CVD") or plasma enhanced CVD ("PECVD"). A maximum size of crystalline particles obtained using such a conventional method is within a range between about 3000 Å and 4000 Å. It is very difficult to obtain crystalline particles having a greater size than the above maximum size, however, increasing a size of crystalline particles is important to obtain high quality poly crystalline silicon.

Methods of forming poly crystalline silicon electronic devices on plastic substrates have been studied. A low temperature process such as a sputtering method is required to form a poly crystalline silicon electronic device so as to prevent plastic from being thermally deformed. The low temperature process is required to prevent a thermal impact being applied to a substrate and a process defect occurring in a high temperature process during manufacturing of a device. Although a plastic substrate is weak to heat, it is light, flexible, and robust. Thus, the plastic substrate has been studied as a substrate of FPD devices.

In general, between 10% and 20% of the original amount of hydrogen remains in an a-Si layer formed using CVD or PECVD. The remaining hydrogen is removed through a dehydrogenation process using a furnace. The dehydrogenation process includes a heat treatment process performed at a high temperature and thus it is difficult to apply such a process to a silicon thin film formed on a plastic substrate weak to heat. Excimer laser annealing ("ELA") is performed at a low temperature to dehydrogenate the silicon thin film formed on the plastic substrate. In ELA, a high energy laser is irradiated onto the silicon thin film for a very short time. Thus, the silicon thin film is ablated due to an evolution of impurities in the silicon film.

A sputtering method uses an inactive gas, and thus hydrogen does not remain in the silicon thin film. Instead of this, an inactive gas used as a gas atmosphere during sputtering, for example, argon Ar, helium He, xenon Xe, or the like is drawn into the silicon thin film. According to an experiment, in a case where Ar is used in a sputtering method, the silicon thin film includes Ar in an amount of between about 1% and 3% after sputtering. In a case where Xe is used in the sputtering method, the silicon thin film includes Xe in an amount of between about 1% or less after sputtering. Although the gas impurities are in a low amount, the gas impurity still badly affects a quality of the silicon thin film, and therefore a gas impurity present in a silicon thin film is required to be minimized. Thus, a heat treatment using a furnace or ELA is required. Although such a heat treatment is used, Ar is not easily removed. In an experiment, Ar is not removed at a temperature of 600° C.

BRIEF SUMMARY OF THE INVENTION

The present invention provides a method of effectively removing a gas impurity present in a silicon thin film.

The present invention also provides a method of manufacturing a high quality silicon thin film containing a small amount of a gas impurity on a substrate weak to heat.

According to exemplary embodiments of the present invention, there is provided a method of degassing a thin layer, the method including applying microwaves having a frequency inducing a resonance of molecules of a gas impurity present in the thin layer formed of a material to remove the gas impurity from the thin layer.

According to other exemplary embodiments of the present invention, there is provided a method of manufacturing a silicon thin film, the method including forming a silicon thin film on a substrate, and applying microwaves having a frequency to the silicon thin film to induce a resonance of molecules of a gas impurity present in the silicon thin film to remove the gas impurity from the silicon thin film.

A wavelength of the microwaves may be within a range between 1 mm and 1 m, and the frequency of the microwaves may be equal to a natural frequency of molecules of the gas impurity.

The silicon thin film may be formed using plasma enhanced chemical vapor deposition ("PECVD") or sputtering. During forming the silicon thin film, a gas used in forming the silicon thin film may be drawn into the silicon thin film as the gas impurity.

The method may further include crystallizing the silicon thin film using excimer laser annealing ("ELA"). The substrate may be a silicon substrate, a glass substrate, or a plastic substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
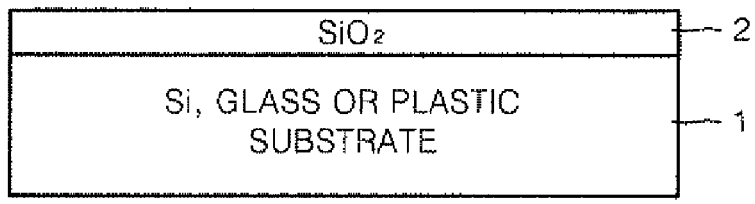
FIGS. 1A through 1D are cross-sectional views illustrating an exemplary method of manufacturing an exemplary silicon thin film according to an exemplary embodiment of the present invention.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as Well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, an exemplary method of manufacturing an exemplary silicon thin film according to the present invention will be further described with reference to the attached drawings.

In exemplary embodiments of the present invention, a gas present in a silicon thin film is removed using high energy microwaves. The silicon thin film may be formed using a well known method. For example, the silicon thin film may be formed on a glass or plastic substrate using PECVD or sputtering. The silicon thin film may be formed on the plastic substrate using sputtering.

A gas may be drawn into the silicon thin film during a layer forming process. For example, hydrogen $H_2$, argon Ar, helium He, xenon Xe, oxygen $O_2$, or the like may be present in the silicon thin film as a gas impurity. These materials have natural frequencies. Thus, if natural frequencies and microwaves of frequencies producing resonance, such as those corresponding to a resonant frequency of the gas impurity present in the silicon thin film, are applied to these materials from an external source, these materials produce resonance, and thus, a resonating impurity can be removed from the silicon thin film. As will be further described below, a degassing method using microwaves provides a more effective degassing effect than conventional degassing methods. An exemplary method of manufacturing an exemplary silicon thin film according to an exemplary embodiment of the present invention will be briefly described.

FIGS. 1A through 1D are cross-sectional views illustrating an exemplary method of manufacturing an exemplary silicon thin film according to an exemplary embodiment of the present invention. As shown in FIG. 1A, a substrate 1 is provided to form a poly crystalline silicon thin film thereon. The substrate 1 may be formed of silicon, glass, or plastic. A $SiO_2$ layer 2 for electrical insulation is formed on the substrate 1. If the substrate 1 is formed of silicon, a natural silicon oxide layer may be formed.

Figure 1B:
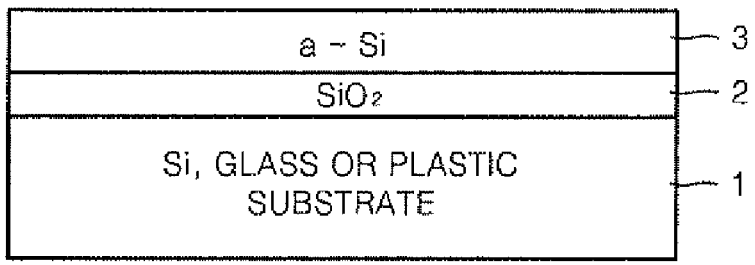

As shown in FIG. 1B, an amorphous silicon ("a-Si") thin film 3 is formed on the substrate 1, such as with the $SiO_2$ layer 2 formed there between. The a-Si thin film 3 may be formed using physical vapor deposition ("PVD") or a plasma enhanced chemical vapor deposition ("PECVD") such as sputtering or the like. Here, a sputtering gas used in a sputtering method enabling low temperature deposition may be a rare gas, for example, Ar, He, or Xe. In an exemplary embodiment, a thickness of the a-Si thin film 3 is adjusted to be about 50 nm, a sputtering power is set to 200 W, and a gas pressure is set to 5 mTorr.

Figure 1C:
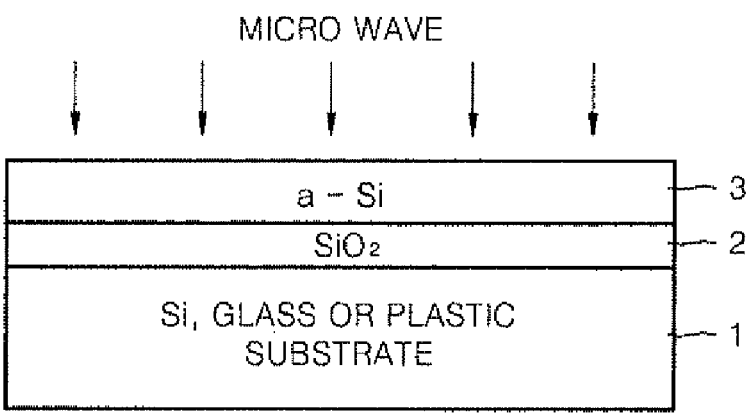

As shown in FIG. 1C, microwaves of a predetermined frequency are applied to the a-Si thin film 3. The microwaves may have a wavelength within a range of about 1 mm to about 1 m. The microwaves correspond to a resonant frequency of a gas impurity present in the a-Si thin film 3. In other words, the frequency of the microwaves may equal a natural frequency of molecules of the gas impurity. According to the resonant frequency, molecules of the gas impurity produce a resonance and thus separate from the a-Si thin film 3. In such a degassing method, a vibration mode of a plurality of modes of the molecules of the gas impurity is induced in a resonance state. Thus, the molecules of the gas impurity separate from the a-Si thin film 3 due to high kinetic energy.

Figure 1D:
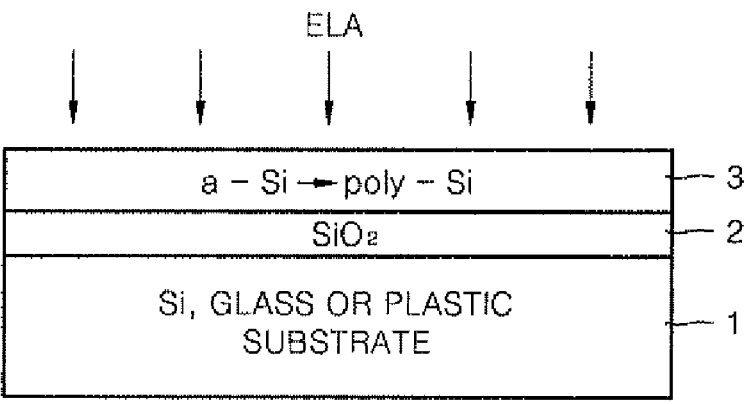

As shown in FIG. 1D, the degassed a-Si thin film 3 is thermally treated using a furnace or excimer laser annealing ("ELA") to obtain a high quality poly crystalline silicon ("poly-Si") thin film. In an exemplary embodiment of the thermal treatment, an energy density of ELA is about 250 mJ/cm2.

Poly-Si obtained using an exemplary method of the present invention as described above is one finished product but also corresponds to a semi-manufactured product applied as an element of an electronic device. A poly-Si thin film may be applied to a thin film transistor ("TFT"), a solar battery, and other devices requiring a poly-Si thin film.

Figure 2A:
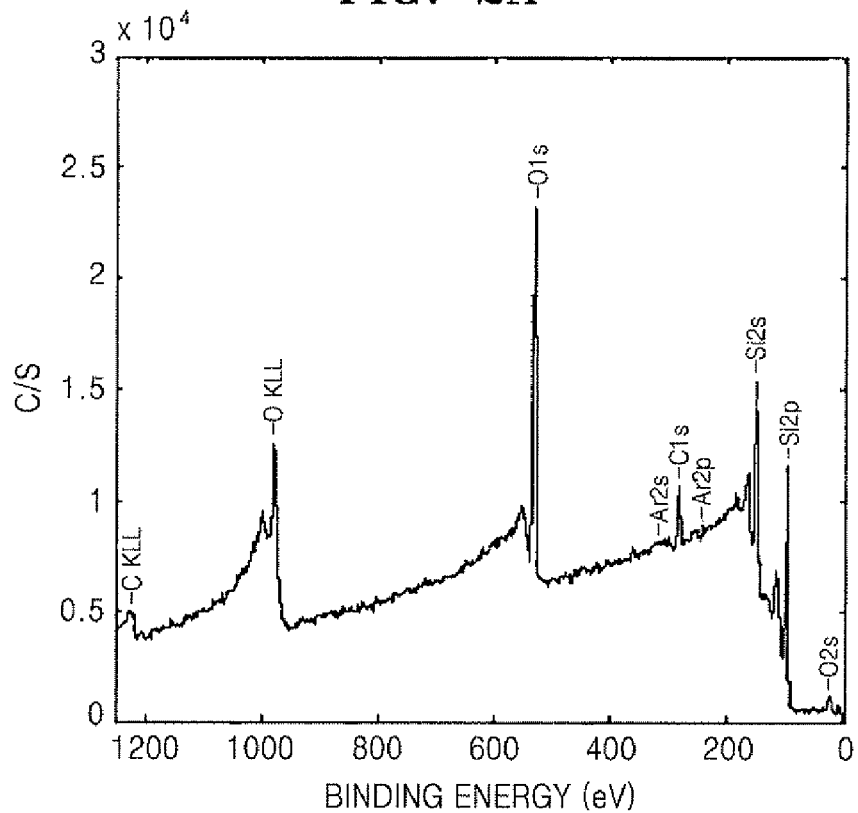
FIG. 2A is an X-ray photoelectron spectroscopy ("XPS") graph of an exemplary silicon thin film obtained in an Ar atmosphere using a sputtering method, which is not degassed.
Figure 2B:
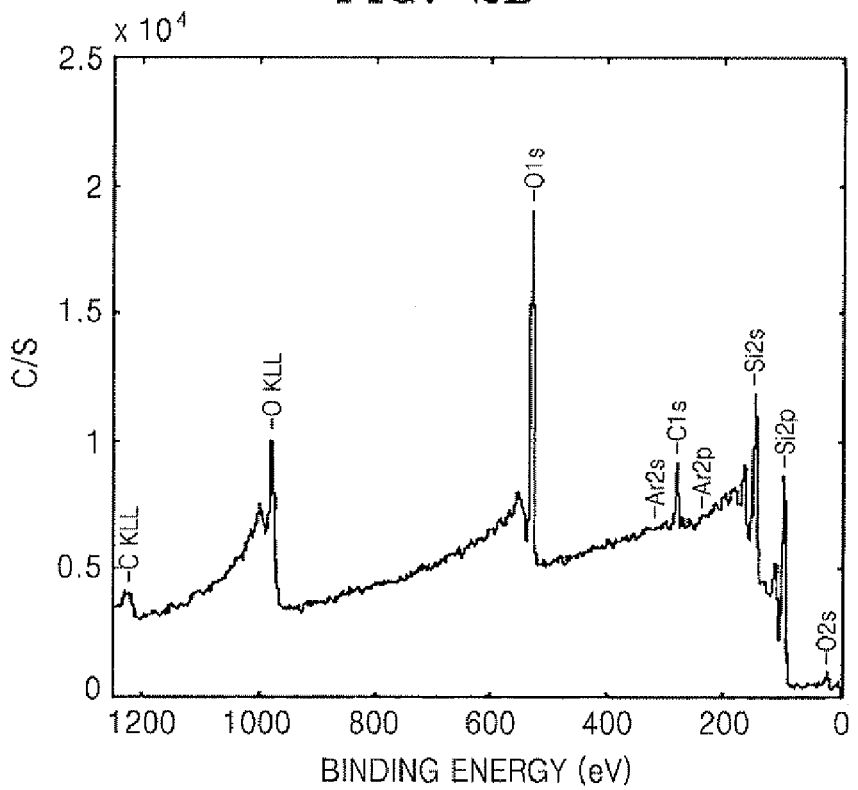
FIG. 2B is an XPS graph of the exemplary silicon thin film that is degassed.

FIG. 2A is an X-ray photoelectron spectroscopy ("XPS") graph illustrating an exemplary silicon thin film, which is obtained in an Ar atmosphere using a sputtering method and is not degassed, and FIG. 2B is an XPS graph illustrating the exemplary silicon thin film that is degassed using microwaves. An XPS system can be used to determine what elements are present within a thin layer of a sample surface, and the quantities of the elements present therein. Using the XPS system, an XPS graph can be obtained which is a plot of the number of electrons detected versus the binding energy of the electrons detected for each element within the surface. Each element produces a characteristic set of XPS peaks at binding energy values identifying each element existing within the surface. The content percentage of a particular element within an irradiated area may be determined using the number of detected electrons in its respective peak. As shown in FIGS. 2A and 2B, a peak of Ar impurity is present. Before the silicon thin film is degassed, a content of the Ar is 0.5%. After the silicon thin film is degassed using microwaves, the content of the Ar is 0.4%. In other words, the amount of Ar present in the degassed silicon thin film is more reduced than the amount of Ar present in the silicon thin film that is not degassed by about 0.1% due to degassing using microwaves. In this particular example, a frequency of the microwaves used during degassing was 2.53 GHz and applied for 15 minutes.

Figure 3A:
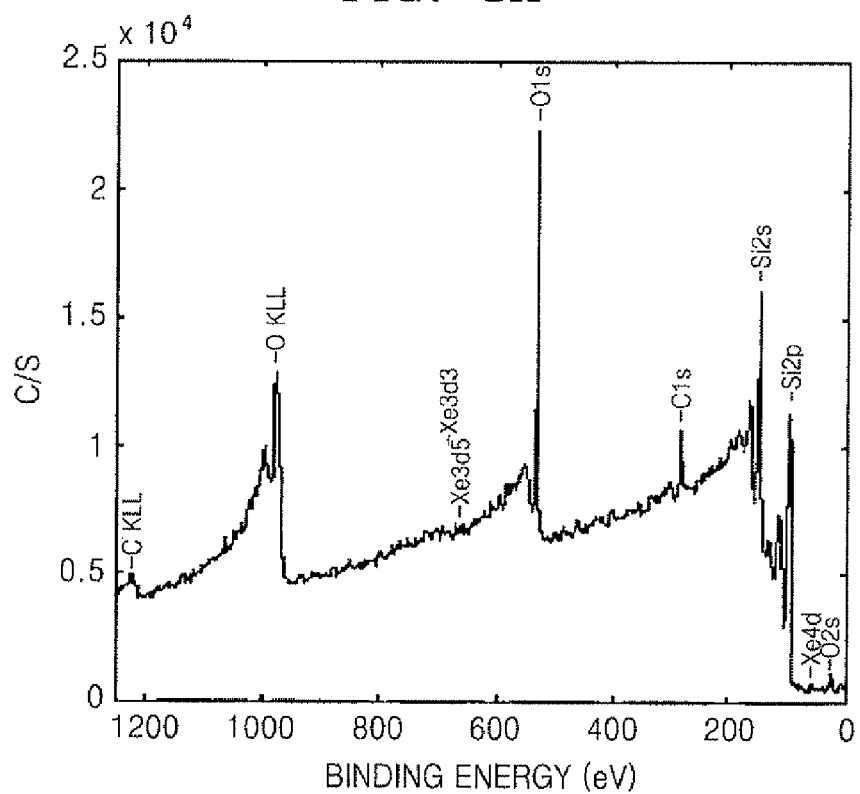
FIG. 3A is an XPS graph of an exemplary silicon thin film obtained in an Xe atmosphere using a sputtering method, which is not degassed.
Figure 3B:
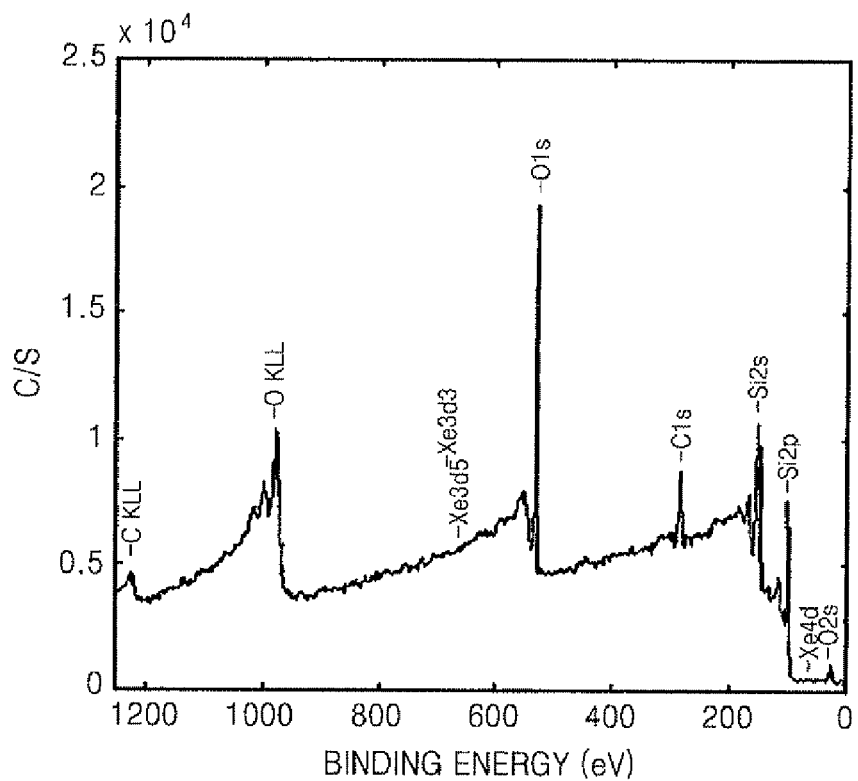
FIG. 3B is an XPS graph of the exemplary silicon thin film that is degassed.

FIG. 3A is an XPS graph illustrating an exemplary silicon thin film obtained in an Xe atmosphere using a sputtering method and not degassed, and FIG. 3B is an XPS graph illustrating the exemplary silicon thin film, which is degassed using microwaves.

As shown in FIGS. 3A and 3B, a peak of Xe is present. Before the silicon thin film is degassed, a content of the Xe is 0.1%. After the silicon thin film is degassed using microwaves, the content of the Xe is 0.03%. In other words, the amount of Xe present in the degassed silicon thin film is reduced by about 70%, as compared to the amount of Xe present in the silicon thin film that is not degassed, due to degassing using the microwaves. In the example, a gas impurity in an amount of 0.03% remains present in a silicon thin film degassed according to the present invention. The content of the gas impurity, however, belongs to a standard deviation range considered as not containing a gas impurity. In this particular example, a frequency of microwaves used during degassing was 2.53 GHz and applied for 15 minutes.

Figure 4A:
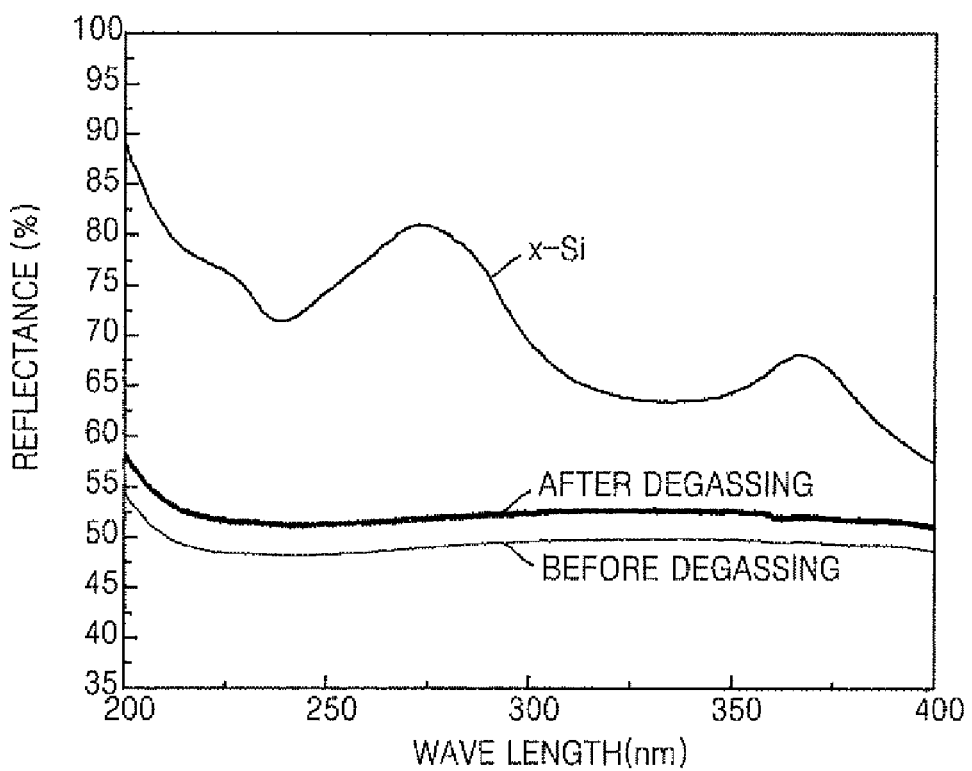
FIG. 4A is a graph illustrating variations in a reflectance of an exemplary silicon thin film obtained in an Ar atmosphere using a sputtering method before and after degassing.

FIG. 4A is a graph illustrating variations in a reflectance of a silicon thin film obtained in an Ar atmosphere with respect to wavelength, i.e., variations in reflectances of single crystalline silicon ("x-Si") and a-Si before and after degassing according to an exemplary embodiment of the present invention is performed. As shown in FIG. 4A, the reflectance of the x-Si varies greatly with wavelength and generally the x-Si shows a very high reflectance. As further shown in FIG. 4A, the silicon thin film shows a relatively higher reflectance after being degassed than before being degassed. The reflectance of the silicon thin film is increased by about 4% due to degassing according to the present invention. The degassing was performed with respect to two samples. Microwaves having a frequency of 2.53 GHz were applied to the first sample for 5-minutes, and the microwaves having the same frequency were applied to the second sample for 15 minutes. In these particular examples, the reflectance after degassing was the same for the two samples. Thus, reflectance curves of the two samples are shown as one in FIG. 4A.

Figure 4B:
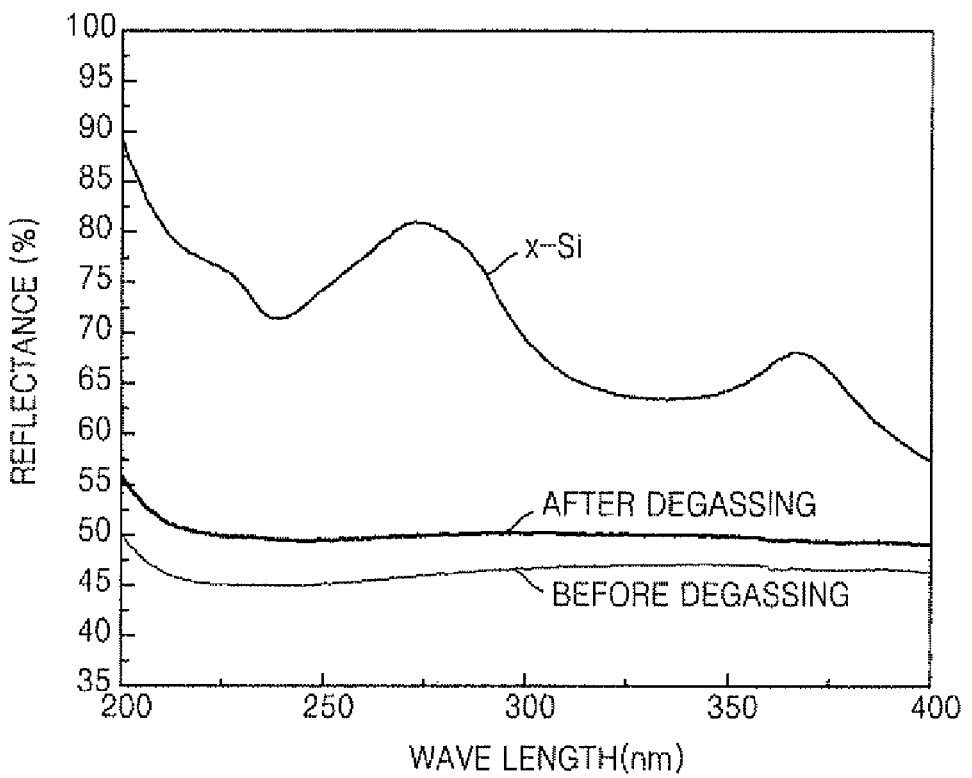
FIG. 4B is a graph illustrating variations in a reflectance of an exemplary silicon thin film obtained in an Xe atmosphere using a sputtering method before and after degassing.

FIG. 4B is a graph illustrating variations in a reflectance of a silicon thin film obtained in an Xe atmosphere with respect to variations in a wavelength, i.e., variations in reflectances of x-Si and a-Si before and after degassing according to exemplary embodiments of the present invention is performed. As shown in FIG. 4B, the reflectance of the x-Si varies greatly with wavelength and generally the x-Si shows a very high reflectance. The silicon thin film shows a relatively higher reflectance after being degassed than before being degassed. The reflectance of the silicon thin film is increased by about 6% due to degassing according to the present invention. In this particular example, a frequency of microwaves used during degassing was 2.53 GHz and was applied for 15 minutes.

While the examples provided above describe particular materials, frequencies, and time periods, it should be understood that these examples are provided for exemplary purposes to further the understanding of the invention, and that the present invention is not limited thereto.

As described above, in an exemplary method of degassing an exemplary thin layer and an exemplary method of manufacturing an exemplary silicon thin film according to exemplary embodiments of the present invention, impurities in the silicon thin film can be effectively reduced. Thus, reliability can be improved during manufacture of a device. As a result, a window of a laser process can be extended. Also, microwaves can be used. Thus, degassing can be performed even at a low temperature. As a result, the device can be prevented from being deteriorated in a high temperature process. In addition, the degassing can be performed in a low temperature process. Thus, a high quality silicon thin film can be formed on a plastic substrate or the like weak to heat using a low microwave degassing process. The present invention can be applied to other degassing methods besides the above-described degassing method.

A poly-Si formed according to exemplary embodiments of the present invention can be applied in the manufacture of various semiconductor devices, for example, a TFT, a thin film diode ("TFD"), a metal insulator metal ("MIM"), etc.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of degassing a thin layer, the method comprising:
    applying microwaves to a thin layer, the microwaves having a frequency corresponding to a resonance frequency of molecules of a gas impurity in the thin layer;
    inducing a resonance of the molecules of the gas impurity present in the thin layer; and
    removing the gas impurity from the thin layer.

2. The method of claim 1, wherein the thin layer is a silicon thin film.

3. The method of claim 2, wherein applying microwaves includes applying microwaves having a wavelength within a range of 1 mm to 1 m.

4. The method of claim 2, wherein applying microwaves having a frequency includes applying microwaves having a frequency equal to a natural frequency of molecules of the gas impurity.

5. The method of claim 1, wherein applying microwaves includes applying microwaves having a wavelength within a range of 1 mm to 1 m.

6. The method of claim 1, wherein applying microwaves having a frequency includes applying microwaves having a frequency equal to a natural frequency of molecules of the gas impurity.

7. A method of manufacturing a silicon thin film, the method comprising:
   forming a silicon thin film on a substrate; and
   applying microwaves having a frequency to the silicon thin film;
   inducing a resonance of molecules of a gas impurity present in the silicon thin film; and
   removing the gas impurity from the silicon thin film.

8. The method of claim 7, wherein applying microwaves having a frequency includes applying microwaves having a frequency equal to a natural frequency of the molecules of the gas impurity.

9. The method of claim 8, wherein forming the silicon thin film includes using one of plasma enhanced chemical vapor deposition and sputtering.

10. The method of claim 8, further comprising crystallizing the silicon thin film.

11. The method of claim 10, wherein forming the silicon thin film includes using one of plasma enhanced chemical vapor deposition and sputtering.

12. The method of claim 7, wherein applying microwaves includes applying microwaves having a wavelength within a range between 1 mm and 1 m.

13. The method of claim 12, wherein forming the silicon thin film includes using one of plasma enhanced chemical vapor deposition and sputtering.

14. The method of claim 12, further comprising crystallizing the silicon thin film.

15. The method of claim 14, wherein forming the silicon thin film includes using one of plasma enhanced chemical vapor deposition and sputtering.

16. The method of claim 7, wherein forming the silicon thin film includes using one of plasma enhanced chemical vapor deposition and sputtering.

17. The method of claim 16, wherein, during forming the silicon thin film, a gas used in forming the silicon thin film is drawn into the silicon thin film as the gas impurity.

18. The method of claim 7, further comprising crystallizing the silicon thin film.

19. The method of claim 18, wherein forming the silicon thin film includes using one of plasma enhanced chemical vapor deposition and sputtering.

20. The method of claim 19, wherein crystallizing the silicon thin film includes heat treatment performed using excimer laser annealing.

21. The method of one of claim 7, wherein the substrate is formed of one of silicon, glass, and plastic.

* * * * *